United States Patent
Schnappenberger et al.

(10) Patent No.: US 10,174,415 B2
(45) Date of Patent: Jan. 8, 2019

(54) METHOD FOR CONTROLLING A GAS SUPPLY TO A PROCESS CHAMBER, CONTROLLER FOR CONTROLLING A GAS SUPPLY TO A PROCESS CHAMBER, AND APPARATUS

(71) Applicants: Frank Schnappenberger, Ingelheim (DE); Anke Hellmich, Kahl (DE); Thomas Koch, Kleinwallstadt (DE); Thomas Deppisch, Aschaffenburg (DE)

(72) Inventors: Frank Schnappenberger, Johannesberg (DE); Anke Hellmich, Kahl (DE); Thomas Koch, Kleinwallstadt (DE); Thomas Deppisch, Aschaffenburg (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/024,001

(22) PCT Filed: Sep. 24, 2013

(86) PCT No.: PCT/EP2013/069857
§ 371 (c)(1),
(2) Date: Mar. 22, 2016

(87) PCT Pub. No.: WO2015/043622
PCT Pub. Date: Apr. 2, 2015

(65) Prior Publication Data
US 2016/0244870 A1    Aug. 25, 2016

(51) Int. Cl.
*C23C 14/00*    (2006.01)
*H01J 37/32*    (2006.01)
*C23C 14/54*    (2006.01)

(52) U.S. Cl.
CPC ........ *C23C 14/0042* (2013.01); *C23C 14/544* (2013.01); *H01J 37/3299* (2013.01); *H01J 37/32449* (2013.01); *H01J 37/32981* (2013.01)

(58) Field of Classification Search
CPC ............... C23C 14/0042; C23C 14/544; H01J 37/32449; H01J 37/32981; H01J 37/3299
(Continued)

(56) References Cited

U.S. PATENT DOCUMENTS 5,702,562 A    12/1997 Wakahara
5,942,089 A    8/1999 Sproul et al.
(Continued)

FOREIGN PATENT DOCUMENTS

WO    0175188 A2    10/2001
WO    2005036607 A2    4/2005

OTHER PUBLICATIONS

Cinese Office Action dated Sep. 12, 2017 for Application No. 201380079751.0.
(Continued)

*Primary Examiner* — P. Macade Nichols
(74) *Attorney, Agent, or Firm* — Patterson & Sheridan, LLP (57) ABSTRACT

A method for controlling a gas supply to a process chamber is provided. The method includes: measuring a gas parameter by each of two or more sensors provided in the process chamber; determining a combined gas parameter from the measured gas parameters; and controlling the gas supply to the process chamber based on the determined combined gas parameter.

17 Claims, 5 Drawing Sheets

(58) Field of Classification Search
USPC ........................................ 137/467.5
See application file for complete search history.

(56) References Cited

U.S. PATENT DOCUMENTS

| | | | |
|---|---|---|---|
| 7,708,802 B1* | 5/2010 | Deane | A61M 16/10 340/500 |
| 2002/0182878 A1 | 12/2002 | Hirose et al. | |
| 2005/0220984 A1* | 10/2005 | Sun | C23C 4/12 427/8 |
| 2011/0295554 A1 | 12/2011 | Baek et al. | |

OTHER PUBLICATIONS

International Search Report and Written Opinion dated Apr. 14, 2014 for Application No. PCT/EP2013/069857.
English Translation of Taiwan Office Action and Search Report for Application No. 103130498, dated Nov. 7, 2017.

* cited by examiner

METHOD FOR CONTROLLING A GAS SUPPLY TO A PROCESS CHAMBER, CONTROLLER FOR CONTROLLING A GAS SUPPLY TO A PROCESS CHAMBER, AND APPARATUS

TECHNICAL FIELD

Embodiments of the present invention disclosure relate to a method for controlling a gas supply to a process chamber, a controller for controlling a gas supply to a process chamber, and an apparatus using the same. Embodiments of the present disclosure invention particularly relate to a method for controlling a gas supply to a process chamber for a reactive process.

BACKGROUND

Several methods are known for depositing a material on a substrate. For instance, substrates may be coated by evaporating, sputtering and chemical vapor deposition. Typically, the process is performed in a process apparatus or process chamber, where the substrate to be coated is located. A deposition material is provided in the apparatus. A plurality of materials, but also oxides, nitrides or carbides thereof, may be used for deposition on a substrate. Further, other processing steps like etching, structuring, annealing, or the like can be conducted in processing chambers.

Coated materials may be used in several applications and in several technical fields. For instance, an application lies in the field of microelectronics, such as generating semiconductor devices. Also, substrates for displays are often coated by a PVD process. Further applications include coating of flexible substrates.

As an example, sputtering is a vacuum coating process used to deposit thin films of various materials onto the surface of a substrate. For example, sputtering can be used to deposit dielectric insulators such as $SiO_2$. During the sputtering process, the coating material is transported from a target to the substrate to be coated by bombarding the surface of the target with ions of an inert gas, which have been accelerated by a high voltage. When the gas ions hit the outer surface of the target, the momentum of the gas ions is transferred to the atoms of the material so that some of the atoms can gain sufficient energy to overcome the binding energy of the atoms in order to escape from the target surface and to deposit on the substrate. The atoms of the material form a film of the desired material. The thickness of the deposited film is, inter alia, dependent on the duration of the substrate's exposure to the sputtering process.

In reactive sputtering, one or more reactive gases such as oxygen and nitrogen could be provided in addition to the inert gas. These gases react with the coating material to form a reaction product, which is deposited on the substrate. Reactive sputtering is particularly used for forming oxides (e.g., $SiO_2$, $Al_2O_3$, $ZnO$), nitrides (e.g., $Si_3N_4$, $TiN$) and oxynitrids (e.g., $SiO_xN_y$). Properties and a quality of the coated layers depend particularly on a flow rate and an amount of the reactive gas supplied to the process chamber. Thus, it is important to precisely control the flow rate and amount of the reactive gas into the process chamber.

However, sensors provided within the process chamber for measuring gas parameters (e.g. a partial pressure of the reactive gas) and used for controlling the flow rate can be subject to contamination and drift. Thus, particularly over time, an accuracy of the sensor readings becomes deteriorated. As a consequence, a precise control of the gas flow is not possible anymore. In such a case, the sensors need to be cleaned or even be replaced.

In view of the above, it is an object to provide a method for controlling a gas supply, particularly a method for controlling a gas supply to a process chamber during vacuum layer deposition, which overcomes at least some of the problems in the art.

SUMMARY

In light of the above, a method for controlling a gas supply to a process chamber provides measuring a gas parameter by each of two or more sensors provided in the process chamber, determining a combined gas parameter from the measured gas parameters, and controlling the gas supply to the process chamber based on the determined combined gas parameter. A controller for controlling a gas supply to a process chamber, wherein two or more sensors each configured to measure a gas parameter are provided in the process chamber, the controller being configured to determine a combined gas parameter of the gas parameters measured by the two or more sensors and control the gas supply to the process chamber based on the determined combined gas parameter is also provided. Further aspects, advantages and features of the present disclosure are apparent from the dependent claims, the description, and the accompanying drawings.

According to one embodiment, a method for controlling a gas supply to a process chamber is provided. The method includes measuring a gas parameter by each of two or more sensors provided in the process chamber; determining a combined gas parameter from the measured gas concentrations; and controlling the gas supply to the process chamber based on the determined combined gas parameter.

According to another embodiment, a controller for controlling a gas supply to a process chamber is provided. Two or more sensors, each configured to measure a gas parameter, are provided in the process chamber. The controller is configured to determine a combined gas parameter of the gas parameters measured by the two or more sensors, and to control the gas supply to the process chamber based on the determined combined gas parameter.

According to yet another embodiment, an apparatus is provided. The apparatus includes a process chamber having at least one gas inlet; two or more sensors each configured to measure a gas parameter in the process chamber; and a controller configured to control a gas flow through the at least one gas inlet to control the gas supply, wherein the controller is configured to determine a combined gas parameter of the gas parameters measured by the two or more sensors, and to control the gas flow based on the determined combined gas parameter.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Although the following description is given with respect to sputtering processes and systems, and particularly with respect to reactive sputtering processes and systems, it is to be understood that the present embodiments are not limited thereto. Instead, the present embodiments could be applied anywhere where a control, and particularly a precise control, of a gas supply is needed. As an example, this may include deposition techniques other than sputtering.

According to some embodiments, which can be combined with other embodiments described herein, a method for controlling a gas supply to a process chamber is provided. The method includes measuring a gas parameter by each of two or more sensors provided in the process chamber; determining a combined gas parameter from the measured gas parameters; and controlling the gas supply to the process chamber based on the determined combined gas parameter.

According to some embodiments, which can be combined with other embodiments described herein, the combined gas parameter is an average gas parameter. Although the following description is given with respect to an average gas parameter, the present disclosure is not limited thereto. Particularly, the gas parameters could be combined in any suitable way, e.g., by calculating sums, differences, products, quotients and the like.

As mentioned above, it can be beneficial to precisely control the flow rate and the amount of the gas into the process chamber. However, sensors provided within the process chamber for measuring gas parameters can be subject to contamination and drift. Thus, particularly over time, an accuracy of the sensor readings becomes deteriorated. As a consequence, a precise control of the gas flow is not possible anymore. In such a case, the sensors need to be cleaned or even be replaced.

The present embodiments overcome this problem by controlling the gas supply based on the combined (average) gas parameter of the two or more sensors. In other words, the gas flow is controlled based on relative values, i.e., the differences between the gas parameters measured by the two or more sensors and the determined average gas parameter. According to some embodiments, the average gas parameter may be used as a setpoint, wherein a gas supply to the process chamber is controlled so that at least one of the measured gas parameters approximately reaches or equals the average gas parameter. According to some embodiments, the setpoint may be provided variable or fixed. Further, in typical embodiments, since the control is performed based on the average value, the total amount of gas supplied to the process chamber may be kept constant, particularly when a zone-based control described later is used. In view of the above, it is possible to cancel out contamination effects and drifts of the sensors and hence, a precise control of the gas supply is possible even when the sensors get contaminated, e.g., by hydrocarbon.

Figure 1:
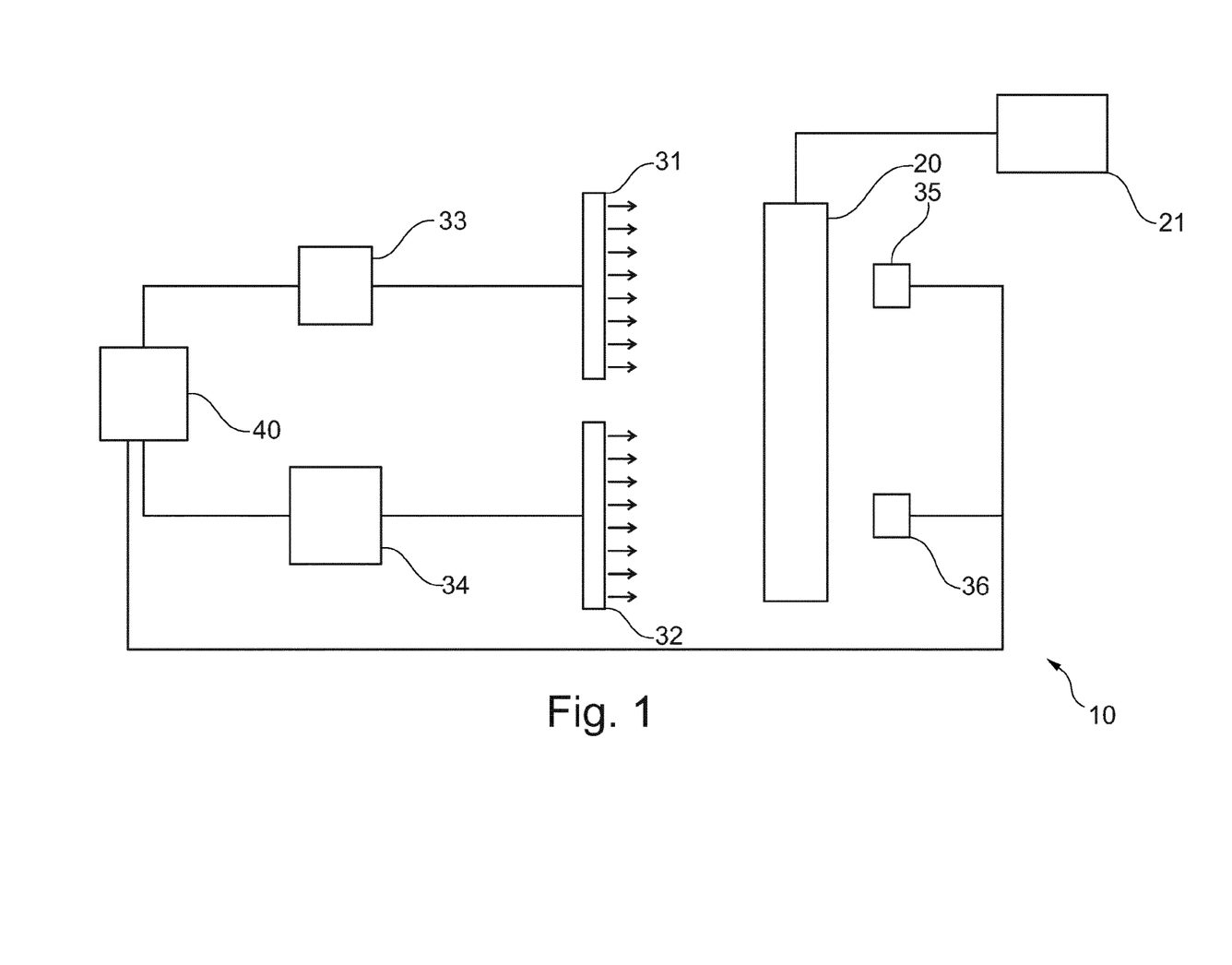
FIG. 1 illustrates a schematic view of a processing system according to embodiments described herein.

FIG. 1 illustrates a schematic view of a processing system 10 according to embodiments described herein. According to typical embodiments, the processing system 10 is configured to perform the method described above and also described later with reference to FIG. 2.

According to some embodiments, which could be combined with other embodiments described herein, the processing system 10 may include two or more sensors 35 and 36 each configured to measure a gas parameter in a process chamber, and a controller 40 configured to control the gas supply to the process chamber. According to some embodiments, the gas supply to the process chamber takes place through one or more gas inlets, such as gas inlets 31 and 32 shown in FIG. 1. According to some embodiments, the controller 40 is configured to determine an average gas parameter of the gas parameters measured by the two or more sensors 35 and 36, and to control the gas supply to the process chamber based on the determined average gas parameter.

According to some embodiments, which could be combined with other embodiments described herein, a target 20 connected to a power source 21 is provided. The power source 21 may be provided outside the process chamber and could be connected to the target 20 via a feed through provided, for instance, in a wall of the process chamber. According to some embodiments, the power source 21 could be provided controllable. For instance, a voltage and/or a current provided by the power source 21 and applied to the target 20 could be controlled. Thereby, for instance a process power (e.g., a sputtering power) could be controlled or adjusted. According to some embodiments, the power (e.g., voltage and/or current) applied to the target 20 is controlled to adjust properties of the deposited layers.

In typical embodiments, the power source 21 is driven in a voltage controlled mode. As an example, a voltage provided by the power source 21 could be in the range of 100 to 5000V, particularly in the range of 100 to 1000V, and particularly approximately 400V. According to some embodiments, the power provided to the target 20 is in the range of 1 to 50 kW, particularly in the range of 5 to 20 kW, and particularly approximately 10 kW.

According to some embodiments, which could be combined with other embodiments described herein, the target 20 may include at least one of aluminum, silicon, titan, and zinc. According to some embodiments, which could be combined with other embodiments described herein, the gas supplied to the process chamber may include at least one of argon (e.g. used as the inert gas in a sputtering process), oxygen, nitrogen, water vapor, ammonia, hydrogen sulfide, methane and tetrafluoromethane. As an example, in a reactive sputtering process, when the target includes silicon and the (reactive) gas supplied to the process chamber is oxygen (while also supplying the inert gas such as argon), a $SiO_2$ layer can be deposited on a substrate.

According to some embodiments, which could be combined with other embodiments described herein, the processing system 10 includes two or more sensors 35 and 36 provided within the process chamber. According to some embodiments, the sensors 35 and 36 are configured to measure the at least one gas parameter. In typical embodiments, the gas parameter could be a gas concentration, a mass (e.g., an atomic, a molecular or a molar mass of the gas) or a pressure. The pressure could be an absolute or a partial pressure of the gas.

According to some embodiments, which could be combined with other embodiments described herein, at least one of the two or more sensors 35 and 36 is selected from the group including a lambda sensor, a pressure gauge, a mass spectrometer, and a residual gas analyzer.

According to some embodiments, which could be combined with other embodiments described herein, the processing system 10 includes at least one gas inlet configured to supply gas into the process chamber. In the example shown in FIG. 1, two gas inlets 31, 32 are provided. However, the present embodiments are not limited thereto, and any suitable number of gas inlets could be provided. Providing two or more gas inlets provides the effect that a zone (section) control of the gas supply is possible. For instance, the two or more gas inlets 31, 32 could be provided at different locations within the process chamber, thereby enabling a zone-based gas supply. This may provide the beneficial effect that a gas distribution within the process chamber can be controlled, for instance, to be uniform.

According to some embodiments, each sensor, e.g., gas sensor, is associated with at least one, and preferably only one, gas inlet 31, 32. In this instance, "associated" may refer to a configuration where the process chamber is divided into two or more sections or zones, and a respective sensor and its associated gas inlet are provided within the same section or zone. A control of the gas supply through a respective gas inlet of the gas inlets according to the embodiments described herein may then be performed based on the difference between the gas parameter measured by the associated sensor and the average gas parameter. According to some embodiments, which could be combined with other embodiments described herein, the number of sensors in the process chamber may equal the number of gas inlets. Thereby, a zone (section) control of the gas supply is possible. This may provide the beneficial effect that a gas distribution within the process chamber can be controlled, for instance, to be uniform. According to some embodiments, a total amount of gas supplied to the process chamber, i.e., a sum of the gas supplied to all zones or sections, is constant.

According to some embodiments, the process chamber could be divided into three sections, e.g., a top, a middle and a bottom section. In each of the sections, at least one gas inlet and at least one sensor could be provided. According to some embodiments, at least one further gas inlet is provided crossing two or more of the sections. As an example, the at least one further gas inlet could be configured as the main gas inlet 51 shown in FIG. 4 and described later.

According to some embodiments, which could be combined with other embodiments described herein, the gas inlet could be configured as a shower head. In this instance, the term "shower head" may refer to a gas distribution device which has a gas distribution plate with a plurality of throughholes for delivering the gas into the process chamber. In the example shown in FIG. 1, two gas inlets 31 and 32 which are configured as shower heads are shown.

According to some embodiments, the through holes or outlets of the showerhead can be provided according to several implementations, which can be provided independent from each other or partly even in combination if not mutually exclusive. The gas may be directed from the showerhead through one or more respective nozzles.

According to some embodiments, which can be combined with other embodiments described herein, the showerhead may be a linear distribution showerhead having a plurality of nozzles. By providing a linear distribution showerhead, a uniformity of the gas distribution can be increased.

According to some embodiments, which could be combined with other embodiments described herein, the gas inlet may be connected to a mass flow controller. In the example of FIG. 1, gas inlets 31, 32 are connected to mass flow controllers 33, 34, respectively. According to typical embodiments, a mass flow controller (MFC) is a device used to measure and control the gas supply (gas flow) to the process chamber. The mass flow controller may operate based on a given setpoint from, e.g., 0 to 100% of its full flow rate. According to some embodiments, the setpoint may be provided by or derived from information received from a controller 40, which will be described later. The mass flow controller may then control the gas supply or flow rate to the given setpoint. According to some embodiments, which could be combined with other embodiments described herein, the mass flow controller may have a gas inlet port, a gas outlet port, a mass flow sensor and a control valve.

According to some embodiments, which could be combined with other embodiments described herein, the processing system 10 includes the above mentioned controller. The controller 40 may be configured for controlling the gas supply to the process chamber according to the embodiments described herein. According to some embodiments, the controller 40 may be configured to determine an average gas parameter of the gas parameters measured by the two or more sensors, and to control the gas supply to the process chamber based on the determined average gas parameter. According to some embodiments, the controller 40 is configured to control the gas supply by controlling the mass flow controllers 33, 34, e.g., by providing the above-mentioned setpoint for respective mass flows to said mass flow controllers 33, 34.

According to some embodiments, the mass flow controllers and the controller 40 are provided as one single entity. According to some other embodiments, the mass flow controllers 33, 34 perform the functions of the controller 40, i.e., the functionality of the controller 40 could be integrated into at least one of the mass flow controllers 33, 34.

According to some embodiments, which could be combined with other embodiments described herein, the controller 40 is configured to perform at least partially the method for controlling the gas supply to the process chamber described in the following with reference to FIG. 2.

Figure 2:
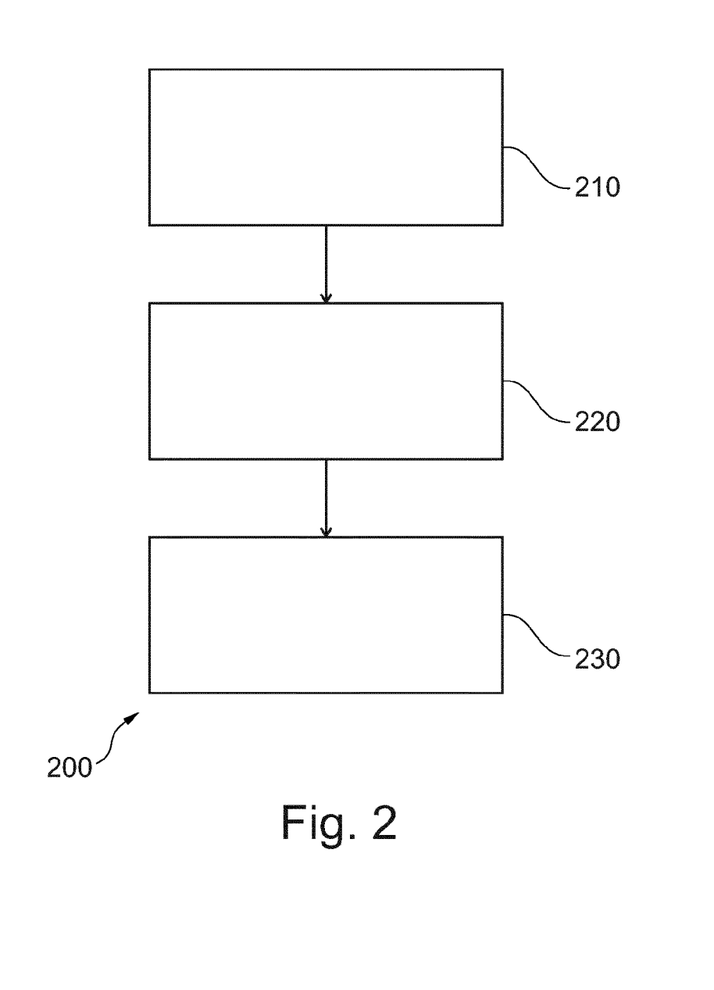
FIG. 2 shows a flowchart of a method for controlling a gas supply to a process chamber according to embodiments described herein.

FIG. 2 shows a flowchart of a method 200 for controlling the gas supply to the process chamber according to embodiments described herein. The descriptions given above with respect to the processing system apply also to the method and the respective elements and devices mentioned (e.g., regarding the system elements such as the power source, target, sensors, controllers and gas inlets).

According to some embodiments, which can be combined with other embodiments described herein, the method 200 for controlling the gas supply to the process chamber includes measuring a gas parameter by each sensor of two or more sensors provided in the process chamber (block 210), determining an average gas parameter from the measured gas parameters (block 220), and controlling the gas supply to the process chamber based on the determined average gas parameter (block 230).

According to some embodiments, which could be combined with other embodiments described herein, controlling the gas supply to the process chamber based on the determined average gas parameter may include controlling the gas supply based on the differences between the individual gas parameters (sensor readings) measured by the two or more sensors and the determined average gas parameter.

According to some embodiments, the average gas parameter may be used as a setpoint, wherein a gas supply to the process chamber is controlled so that at least one of the measured gas parameters approximately reaches or equals the average gas parameter. As an example, the setpoint may be variable or fixed. The measured gas parameters may represent absolute values of the gas parameter, or may represent relative values of the gas parameter. Further, in typical embodiments, since the control is performed based on the average value, the total amount of gas supplied to the process chamber may be kept constant, particularly when the above-explained zone-based control is used. In view of the above, it is possible to cancel out contamination effects and drifts of the sensors and hence, a precise control of the gas supply is possible even when the sensors get contaminated, e.g., by hydrocarbon.

According to typical embodiments, which can be combined with other embodiments described herein, in block 210, the gas parameter could be a gas concentration, a mass (e.g., an atomic, a molecular or a molar mass of the gas) or a pressure. The pressure could be an absolute or a partial pressure of the gas.

According to typical embodiments, which can be combined with other embodiments described herein, in block 210, the measuring the gas parameter includes measuring, by each sensor, two or more gas parameter values within a time interval. For instance, the two or more gas parameter values could be measured equally or unequally distributed over the time interval. Thereby, e.g. fluctuations in the sensor reading could be smoothed out. According to typical embodiments, the time interval could be in the range of 0.01 to 1 s or in the range of 0.1 to 05 s, and could particularly be approximately 0.1 s.

According to typical embodiments, which can be combined with other embodiments described herein, in block 220, the average gas parameter is determined from the gas parameter values measured within the time interval. As an example, at least some of the measured values of the sensors are added and then divided by the number of gas parameter values involved, to thereby obtain the average gas parameter. According to some embodiments, a weighting factor could be applied to one or more of the measured gas parameter values.

According to other typical embodiments, which can be combined with other embodiments described herein, the block 220 includes determining, for each sensor, a sensor combined value from the gas parameter values measured by the respective sensor in the time interval.

According to some embodiments, which can be combined with other embodiments described herein, the sensor combined value is a sensor average value. Although the following description is given with respect to a sensor average value, the present disclosure is not limited thereto. Particularly, the values could be combined in any suitable way, e.g., by calculating sums, differences, products, quotients and the like.

According to some embodiments, the average gas parameter is then determined based on the sensor average values. As an example, for each sensor a sensor average value is determined, and then the sensor average values are added and divided by the number of sensor average values involved to obtain the average gas parameter. According to some embodiments, a weighting factor could be applied to one or more of the sensor average values.

According to some embodiments, which can be combined with other embodiments described herein, controlling the gas supply in block 230 includes adjusting the gas supply such that the gas parameter measured by at least one of the two or more sensors corresponds to the average gas parameter. Thus, the gas flow is controlled based on relative values, i.e., the differences between the individual gas parameters measured by the two or more sensors and the determined average gas parameter.

According to some embodiments, which can be combined with other embodiments described herein, the average gas parameter used for controlling the gas supply to the process chamber is updated continuously or in predetermined time intervals. According to some embodiments, which can be combined with other embodiments described herein, the average gas parameter used for controlling the gas supply to the process chamber is determined once. For instance, the average gas parameter is determined once and then used for a certain time, e.g., a predetermined time interval or for a process time. As an example, the average gas parameter could be determined once before starting a process (e.g., a sputter process) and be used during the process, or could be updated at least once or even continuously during the process.

According to some embodiments, which can be combined with other embodiments described herein, the gas supply utilizes a control loop feedback method. As an example, the control loop feedback involves a P (proportional) control, a PI (proportional, integral) control, or a PID (proportional, integral, differential) control. According to some embodiments, the average gas parameter is used as a setpoint for the control loop feedback method, e.g., for the P, PI or PID control.

According to some embodiments, which can be combined with other embodiments described herein, adjusting the P, I or D parameter could be done manually, according to a Ziegler-Nichols method, or by use of software.

According to some embodiments, which can be combined with other embodiments described herein, the controlling the gas supply includes controlling a gas flow through one or more gas inlets. As an example, this may be the gas inlets described above with reference to FIG. 1. According to some embodiments, the controlling the gas flow through the one or more gas inlets is performed by the above-mentioned P (proportional) control, a PI (proportional, integral) control, or a PID (proportional, integral, differential) control.

According to some embodiments, which can be combined with other embodiments described herein, the gas supply is further controlled based on a process power. As an example, the gas supply could be controlled to adjust the process power. Referring to FIG. 1, the gas supply could be controlled to adjust a sputtering power provided by the power source 21. For instance, a power provided by the power source 21 could be determined or measured, e.g., by using a voltage and/or a current applied to the target 20, and the gas supply could be controlled to achieve a set power. As an example, the set power could be approximately 10 kW, wherein the gas supply could then be adjusted such that the power approximately corresponds to the set power. According to some embodiments, the controlling could utilize a P (proportional) control, a PI (proportional, integral) control, or a PID (proportional, integral, differential) control.

According to some embodiments, the controlling the gas supply based on the process power may include controlling a gas flow through the one or more gas inlets which are also controlled based on the average gas parameter. As an example, an offset could be added to or subtracted from the average gas parameter, wherein the offset is determined based on the currently measured process power and the set power. According to some other embodiments, controlling the gas supply based on the process power may include controlling a gas flow through one or more gas inlets which are separate and independent from the one or more gas inlets controlled based on the average gas parameter (such as the main gas inlet 51 in FIG. 4, which is separate and independent from the gas inlets 31, 32 controlled based on the average gas parameter). However, both embodiments could be combined, too. For instance, a separate gas inlet such as the main gas inlet 51 of FIG. 4 could be provided and also a process power-based control of the gas flow through the one or more gas inlets which are also controlled based on the average gas parameter could be performed.

According to some embodiments, which can be combined with other embodiments described herein, the method is performed during a reactive process, preferably a reactive sputtering process.

Figure 3:
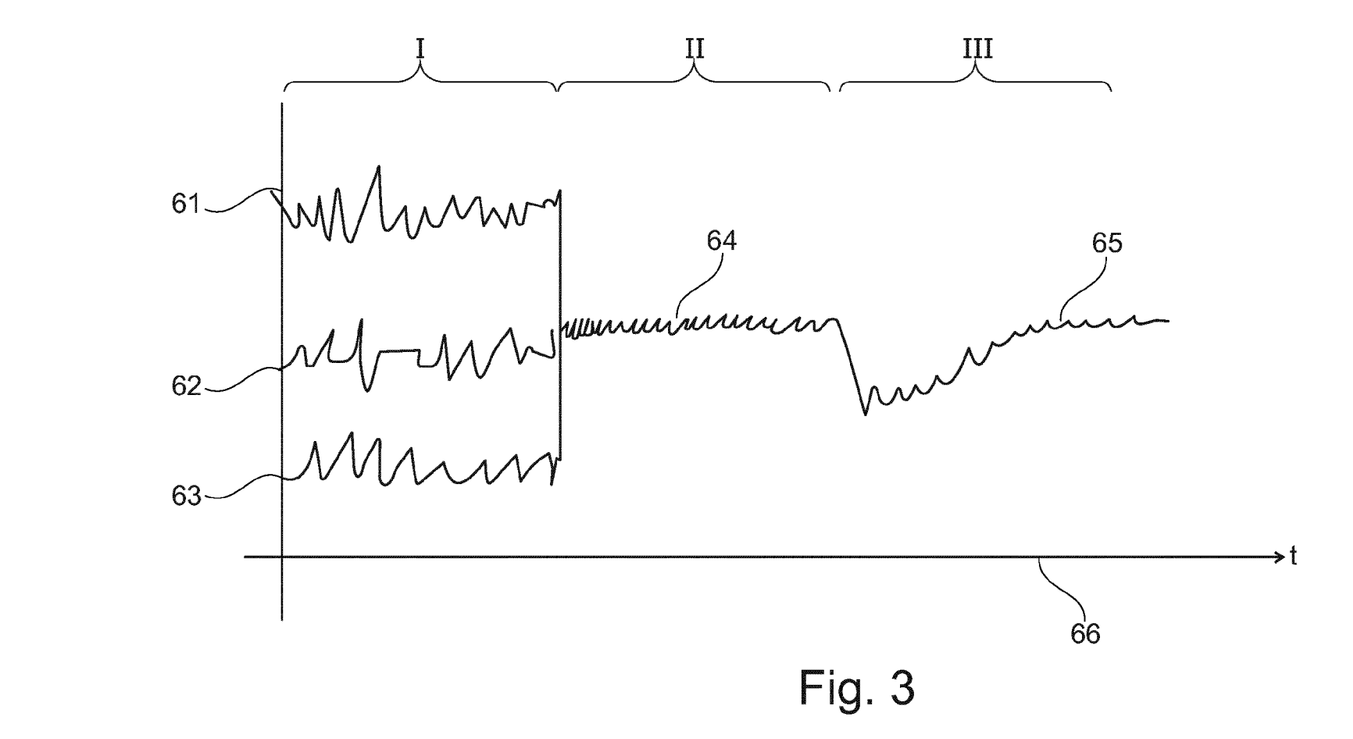
FIG. 3 shows a graph illustrating the controlling of the gas supply to the process chamber according to embodiments described herein.

FIG. 3 shows a graph illustrating the controlling of the gas supply to the process chamber according to embodiments described herein. In FIG. 3, reference numeral 66 denotes a time axis.

In time region (I), three sensors provide three measuring signals 61, 62 and 63 of a gas parameter. The three measuring signals 61, 62 and 63 in time region (I) are different. However, the present embodiments are not limited to the provision of three sensors, and any number of sensors (e.g., two as in FIGS. 1, 4 and 5, or four and more) could be provided. According to some embodiments, in time region (I), no control of the gas supply to the process chamber based on the determined average gas parameter is performed.

In time region (II), the controlling the gas supply to the process chamber based on the determined average gas parameter is performed. Reference numeral 64 denotes the three measuring signals that now approximately correspond to the average gas parameter due to the control of the gas supply based on the average gas parameter. Thus, the gas flow is controlled based on relative values, i.e., the differences between the individual gas parameters or sensor readings measured by the two or more sensors and the determined average gas parameter.

In time region (III), the controlling the gas supply to the process chamber based on the determined average gas parameter is still performed, wherein a process, e.g., a sputtering process, is in progress.

Figure 4:
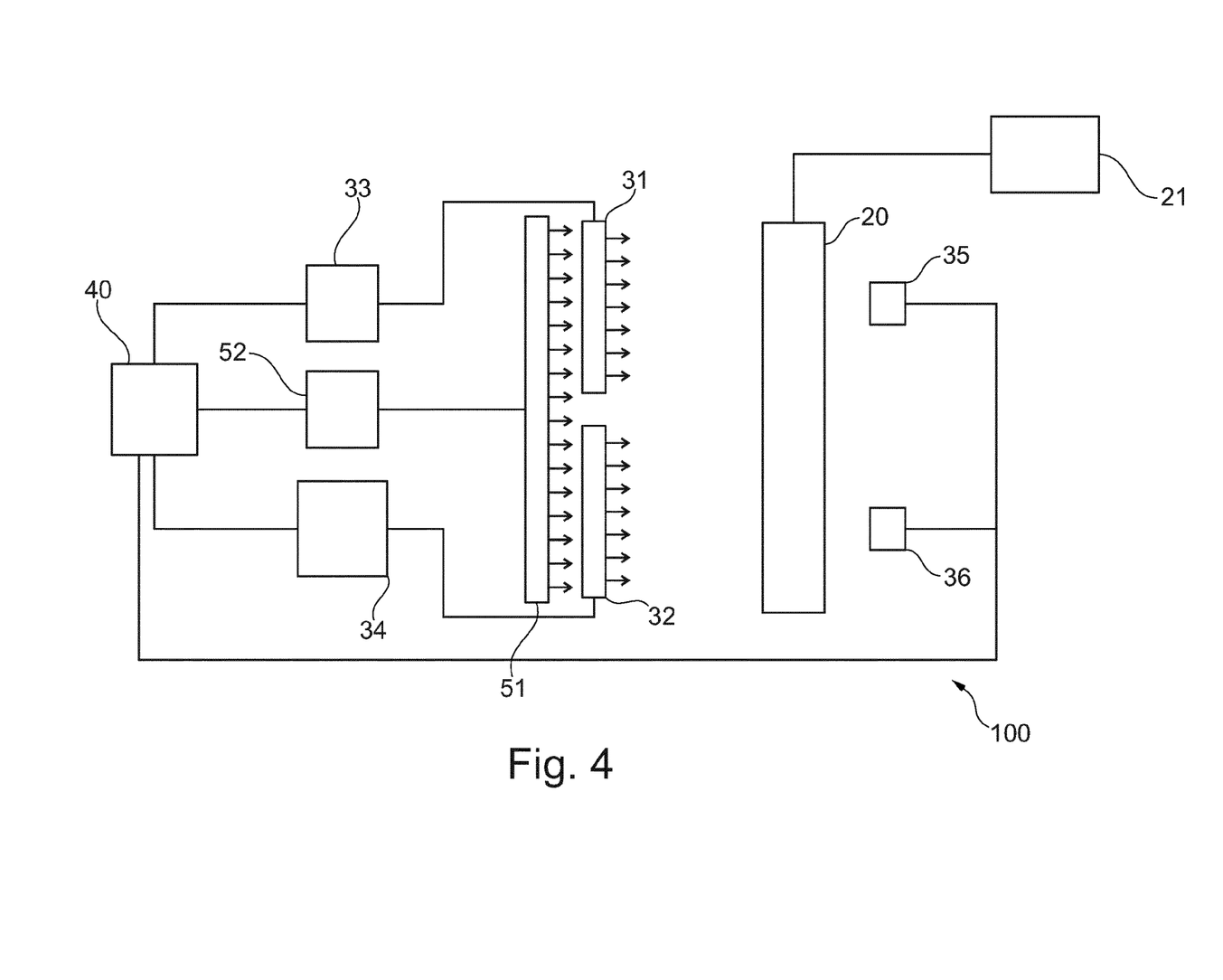
FIG. 4 illustrates a schematic view of another processing system according to embodiments described herein.

FIG. 4 illustrates a schematic view of another processing system 100 according to embodiments described herein, which is similar to the processing system 10 described above with reference to FIG. 1. Thus, descriptions of identical or similar elements given above also apply to the processing system 100 shown in FIG. 4.

The difference between the processing system of FIG. 1 and the processing system of FIG. 4 lies in that the processing system 100 further includes a main gas inlet 51 and a main mass flow controller 52 (main MFC).

According to some embodiments, which can be combined with other embodiments described herein, the main gas inlet 51 and the main mass flow controller 52 are provided to adjust a process power by controlling the gas supply through said main gas inlet 51. The gas supply could be controlled to adjust a sputtering power provided by the power source 21 shown in FIG. 1 and as described above. For instance, a power provided by the power source could be determined or measured, e.g., by using a voltage and/or a current applied to the target, and the gas supply through the main gas inlet 51 could be controlled so that the measured power approximately corresponds to a set power. As an example, the set power could be approximately 10 kW, wherein the gas supply could then be adjusted such that the power approximately corresponds to the set power. According to some embodiments, the controlling could utilize a P (proportional) control, a PI (proportional, integral) control, or a PID (proportional, integral, differential) control.

According to some embodiments, which could be combined with other embodiments described herein, the main gas inlet 51 could be configured as a shower head, similar as described above with reference to FIG. 1. In this instance, the term "shower head" may refer to a gas distribution device which has a gas distribution plate with a plurality of through-holes for delivering the gas into the process chamber. In the example shown in FIG. 4, the gas inlets ("31", "32", "51") are configured as shower heads.

According to some embodiments, the controlling the gas supply based on the process power may further include controlling a gas flow through the one or more gas inlets which are also controlled based on the average gas parameter. As an example, an offset could be added to or subtracted from the average gas parameter, wherein the offset is determined based on the currently measured process power and the set power.

Figure 5:
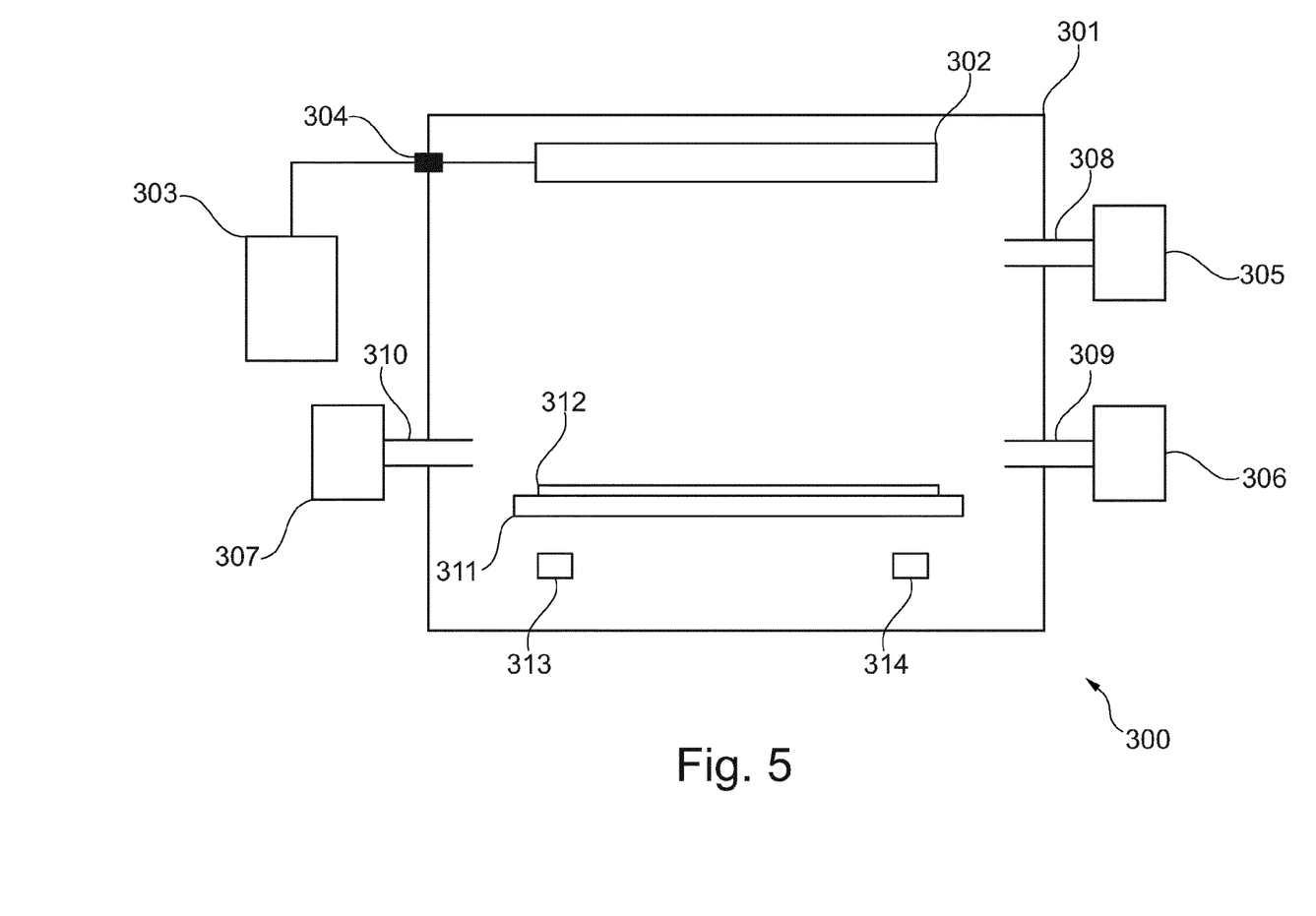
FIG. 5 illustrates a deposition apparatus having a processing system according to embodiments described herein.

FIG. 5 illustrates a configuration of a deposition apparatus 300, e.g. a sputtering apparatus, having a processing system according to embodiments described herein. The processing system included in the apparatus of FIG. 5 may be configured identically or similarly to the processing systems described above with reference to FIGS. 1 and 4.

FIG. 5 shows a schematic cross-section of a sputtering apparatus 300 having a sputtering chamber 301. The sputtering chamber 301 is limited by sputtering chamber walls. In a typical embodiment, the sputtering apparatus 300 includes a target 302, which may include one or more rotating cylindrical target assemblies. According to some embodiments, which could be combined with other embodiments described herein, the target 302 may include at least one of aluminum, silicon, titan, niobium, zinc, and an alloy like indium gallium zinc oxide (IGZO).

According to some embodiments, which could be combined with other embodiments described herein, the target 302 is connected to a power source 303. The power source 303 may be provided outside the sputtering chamber 301 and could be connected to the target 302 via a feed through 304 provided for instance in a wall of the sputtering chamber 301. According to some embodiments, the power could be controllable so as to adjust for instance a sputtering power. As an example, the power source 303 could provide a voltage, and preferably a constant voltage. In a typical embodiment, the voltage is controllable so as to adjust for instance the sputtering power. According to some embodiments, the power or voltage applied to the target 302 could be controlled so as to adjust properties of the deposited layers. As an example, the sputtering power is in the range of 1 to 50 kW, particularly in the range of 5 to 20 kW, and particularly approximately 10 kW. In typical embodiments, the power source 303 is driven in a voltage controlled mode. As an example, a voltage provided by the power source 303 could be in the range of 100 to 5000V, particularly in the range of 100 to 1000V, and particularly approximately 400V.

According to some embodiments, which could be combined with other embodiments described herein, the apparatus 300 may include two or more sensors 313, 314 each configured to measure a gas parameter in the sputtering chamber 301, and a controller (not shown) adapted to control the gas flow through the gas inlets 309, 310 described later. According to some embodiments, the controller is configured to determine an average gas parameter of the gas parameters measured by the sensors 313, 314, and to control the gas supply to the sputtering chamber 301 through the gas inlets 309, 310 based on the determined average gas parameter as described above with reference to FIGS. 1 to 4.

Further, in the sputtering chamber 301, a substrate 312 is disposed below the target 302. The substrate 312 may be arranged, in a typical embodiment, which may be combined with other embodiments disclosed herein, on a substrate support 311. In a typical embodiment, which may be combined with other embodiments disclosed herein, a substrate support device for a substrate to be coated is disposed in the sputtering chamber 301. For example, the substrate support device may include conveying rolls, magnet guiding systems and further features.

In further embodiments, the sputtering chamber 301 may include substrate drive systems for driving a substrate 312 to be coated in or out of the sputtering chamber 301. For that reason, the sputtering chamber 301 may include a vacuum lock chamber disposed at a wall of the sputtering chamber 301.

In operation, a plasma is formed inside the sputtering chamber 301 between the target 302 and an anode by exciting a sputtering gas, i.e., an inert gas provided e.g. through a first gas inlet 308. In a typical embodiment, the anode is disposed below the substrate 312 to be coated. In a typical embodiment, the sputtering gas includes argon. Also other inert gases may be used in some embodiments for sputtering.

According to some embodiments, the process, such as the sputtering process, may include a DC (direct current)-process, an MF (middle frequency)-process, and a HF (high frequency)-process. In the MF-process, two or more targets could be provided, wherein a state of the two or more targets changes. As an example, one target may be a cathode and another one, e.g., an adjacent one, may be an anode, and vice versa.

In typical embodiments, the substrate 312 may be made from any material suitable for material deposition. For instance, the substrate 312 may be made from a material selected from the group consisting of glass (for instance soda-lime glass, borosilicate glass etc.), metal, polymer, ceramic, compound materials, carbon fiber materials or any other material or combination of materials which can be coated by a deposition process.

According to some embodiments, large area substrates may have a size of at least 0.174 m$^2$. Typically the size can be about 1.4 m$^2$ to about 8 m$^2$, more typically about 2 m$^2$ to about 9 m$^2$ or even up to 12 m$^2$. For instance, a large area substrate can be GEN 5, which corresponds to about 1.4 m$^2$ substrates (1.1 m×1.3 m), GEN 7.5, which corresponds to about 4.39 m$^2$ substrates (1.95 m×2.25 m), GEN 8.5, which corresponds to about 5.5 m$^2$ substrates (2.2 m×2.5 m), or even GEN 10, which corresponds to about 8.7 m$^2$ substrates (2.85 m×3.05 m). Even larger generations such as GEN 11 and GEN 12 and corresponding substrate areas can similarly be implemented.

The sputtering chamber 301 further includes the first gas inlet 308, connected to a first gas source 305. The first gas source 305 may be, for example, a source for an inert gas, such as argon. Further, a valve or a pump (not shown) may be disposed in a fluid or gas connection between the first gas source 305 and the sputtering chamber 301 for controlling the flow rate and/or the quantity of the inert gas provided to sputtering chamber 301.

The sputtering chamber 301 further includes a second gas inlet 309 connected to a second gas source 306, and a third gas inlet 310 to a third gas source 307. The second gas source 306 and the third gas source 307 may include, in a typical embodiment, nitrogen, water vapor, ammonia, hydrogen sulfide, methane and tetrafluoromethane. As an example, in a reactive sputtering process, when the target includes silicon and the (reactive) gas supplied to the process chamber is oxygen (while also supplying the inert gas such as argon), a SiO2 layer can be deposited on a substrate.

According to some embodiments, which could be combined with other embodiments described herein, at least one of the gas supplies through the second gas inlet 309 and the third gas inlet 310 is controlled based on the average gas parameter as described above.

According to the embodiments described herein, the present embodiments control the gas supply based on the average gas parameter of the two or more sensors. In other words, the gas flow is controlled based on relative values, i.e., the differences between the gas parameters measured by the two or more sensors and the determined average gas parameter. According to some embodiments, the average gas parameter may be used as a setpoint, wherein a gas supply to the process chamber is controlled so that at least one of the measured gas parameters approximately reaches or equals the average gas parameter. Further, in typical embodiments, since the control is performed based on the average value, the total amount of gas supplied to the process chamber may be kept constant, particularly when a zone-based control as described above is used. In view of the above, it is possible to cancel out contamination effects and drifts of the sensors and hence, a precise control of the gas supply is possible even when the sensors get contaminated, e.g., by hydrocarbon.

While the foregoing is directed to embodiments of the disclosure, other and further embodiments of the disclosure may be devised without departing from the basic scope thereof, and the scope thereof is determined by the claims that follow.

The invention claimed is:

1. A method for controlling a gas supply to a process chamber, comprising:
    measuring a gas parameter by each of two or more sensors provided in the process chamber by measuring, by each of the two or more sensors, two or more gas parameter values within a time interval, the process chamber having a sputter target disposed therein;
    determining a combined gas parameter from the measured gas parameters; and
    controlling the gas supply to the process chamber based on the determined combined gas parameter.

2. The method of claim 1, wherein the gas parameter is a gas concentration, a mass or a pressure.

3. The method of claim 1, wherein the combined gas parameter is determined from the two or more gas parameter values.

4. The method of claim 1, further including:
    determining, for each sensor, a sensor combined value from the gas parameter values measured by the respective sensor in the time interval.

5. The method of claim 4, wherein the combined gas parameter is determined based on the sensor combined values.

6. The method of claim 1, wherein controlling the gas supply includes adjusting the gas supply such that the gas parameter measured by at least one of the two or more sensors corresponds to the combined gas parameter.

7. A method for controlling a gas supply to a process chamber, comprising:
measuring a gas parameter by each of two or more sensors provided in the process chamber, the process chamber having a sputter target disposed therein;
determining a combined gas parameter from the measured gas parameters, the combined gas parameter being an average gas parameter; and
controlling the gas supply to the process chamber based on the determined combined gas parameter.

8. The method of claim 1, wherein the gas supply is further controlled based on a process power.

9. The method of claim 1, wherein controlling the gas supply utilizes P, PI or PID control.

10. The method of claim 1, wherein the controlling the gas supply includes controlling a gas flow through one or more gas inlets.

11. A method for controlling a gas supply to a process chamber, comprising:
measuring a gas parameter by each of two or more sensors provided in the process chamber, the process chamber having a sputter target disposed therein;
determining a combined gas parameter from the measured gas parameters; and
controlling the gas supply to the process chamber based on the determined combined gas parameter during a reactive process or a reactive sputtering process.

12. A controller for controlling a gas supply to a process chamber, the controller being configured to:
measure a gas parameter by two or more sensors in the process chamber by measuring, by each of the two or more sensors, two or more gas parameter values within a time interval, the process chamber having a sputter target disposed therein;
determine a combined gas parameter of the gas parameters measured by the two or more sensors; and
control the gas supply to the process chamber based on the determined combined gas parameter.

13. The controller of claim 12, wherein the controller is configured to adjust the gas supply such that the gas parameter measured by at least one of the two or more sensors corresponds to the combined gas parameter.

14. An apparatus, comprising:
a process chamber having at least one gas inlet;
a sputter target disposed in the process chamber;
two or more sensors each configured to measure a gas parameter in the process chamber; and
a controller for controlling a gas supply to the process chamber, the controller being configured to:
measure a gas parameter by two or more sensors in the process chamber by measuring, by each of the two or more sensors, two or more gas parameter values within a time interval;
determine a combined gas parameter of the gas parameters measured by the two or more sensors; and
control the gas supply to the process chamber based on the determined combined gas parameter.

15. The apparatus of claim 14, wherein at least one of the two or more sensors is a lambda sensor, a pressure gauge, a mass spectrometer or a residual gas analyzer.

16. An apparatus, comprising:
a process chamber having at least one gas inlet;
a sputter target disposed in the process chamber;
two or more sensors each configured to measure a gas parameter in the process chamber; and
a controller for controlling a gas supply to the process chamber, the controller being configured to:
measure a gas parameter by two or more sensors in the process chamber by measuring, by each of the two or more sensors, two or more gas parameter values within a time interval;
determine a combined gas parameter of the gas parameters measured by the two or more sensors; and
control the gas supply to the process chamber based on the determined combined gas parameter, the controller being configured to adjust the gas supply such that the gas parameter measured by at least one of the two or more sensors corresponds to the combined gas parameter.

17. The apparatus of claim 16, wherein at least one of the two or more sensors is selected from the group including a lambda sensor, a pressure gauge, a mass spectrometer and a residual gas analyzer.

* * * * *

UNITED STATES PATENT AND TRADEMARK OFFICE
CERTIFICATE OF CORRECTION

PATENT NO. : 10,174,415 B2
APPLICATION NO. : 15/024001
DATED : January 8, 2019
INVENTOR(S) : Frank Schnappenberger et al.

It is certified that error appears in the above-identified patent and that said Letters Patent is hereby corrected as shown below:

On the Title Page

Item (71), Lines 1-2, delete "Ingelheim (DE);" and insert -- Johannesberg (DE); --, therefor.

Item (56), Line 1, delete "Cinese" and insert -- Chinese --, therefor.

In the Specification

Column 1, Line 10, delete "present invention disclosure" and insert -- present disclosure --, therefor.

Column 1, Line 14, delete "present disclosure invention" and insert -- present disclosure --, therefor.

Column 1, Line 39, delete "SiO2." and insert -- $SiO_2$. --, therefor.

Column 1, Line 57, delete "SiO2, Al2O3," and insert -- $SiO_2$, $Al_2O_3$, --, therefor.

Column 1, Line 57, delete "Si3N4," and insert -- $Si_3N_4$, --, therefor.

Column 1, Line 58, delete "SiOxNy)." and insert -- $SiO_xN_y$). --, therefor.

Column 12, Line 6, delete "pas" and insert -- gas --, therefor.

Signed and Sealed this
Fifth Day of March, 2019

Andrei Iancu
*Director of the United States Patent and Trademark Office*